US 7,446,986 B2

United States Patent
Araki et al.

(10) Patent No.: US 7,446,986 B2
(45) Date of Patent: *Nov. 4, 2008

(54) MAGNETIC TUNNEL JUNCTION WITH IN STACK BIASING LAYER PROVIDING ORTHOGONAL EXCHANGE COUPLING

(75) Inventors: Satoru Araki, San Jose, CA (US); Jeffrey Robinson Childress, San Jose, CA (US); Stefan Maat, San Jose, CA (US); Daniele Mauri, San Jose, CA (US); Matthew Joseph Carey, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 468 days.

This patent is subject to a terminal disclaimer.

(21) Appl. No.: 10/931,677

(22) Filed: Aug. 31, 2004

(65) Prior Publication Data

US 2006/0044707 A1     Mar. 2, 2006

(51) Int. Cl.
G11B 5/39     (2006.01)
(52) U.S. Cl. ............................. 360/324.12; 360/324.11
(58) Field of Classification Search ... 360/324.1–324.2, 360/324.12
See application file for complete search history.

(56) References Cited

U.S. PATENT DOCUMENTS

| | | | |
|---|---|---|---|
| 5,465,185 A | 11/1995 | Heim et al. | 360/113 |
| 5,712,612 A | 1/1998 | Lee et al. | 338/32 R |
| 5,835,314 A | 11/1998 | Moodera et al. | 360/113 |
| 6,023,395 A | 2/2000 | Dill et al. | 360/113 |
| 6,114,719 A | 9/2000 | Dill et al. | 257/295 |
| 6,438,026 B2 | 8/2002 | Gillies et al. | 365/158 |
| 6,473,279 B2 | 10/2002 | Smith et al. | 360/324.12 |
| 6,600,184 B1 | 7/2003 | Gill | 257/295 |
| 6,671,139 B2 | 12/2003 | Carey et al. | 360/324.12 |
| 6,704,175 B2 * | 3/2004 | Li et al. | 360/324.11 |
| 6,710,984 B1 | 3/2004 | Yuasa et al. | 360/324.11 |
| 6,714,388 B2 | 3/2004 | Hasegawa et al. | 360/324.11 |
| 6,721,146 B2 | 4/2004 | Beach | 360/324.12 |
| 6,747,852 B2 * | 6/2004 | Lin et al. | 360/324.12 |
| 6,985,338 B2 * | 1/2006 | Gill | 360/324.12 |
| 7,023,670 B2 | 4/2006 | Saito | 360/324.12 |
| 2003/0017364 A1 | 1/2003 | Kikitsu et al. | 428/693 |
| 2003/0035249 A1 | 2/2003 | Ho et al. | 360/321 |
| 2003/0137780 A1 | 7/2003 | Fontana, Jr. et al. | 360/324.2 |
| 2003/0143431 A1 | 7/2003 | Hasegawa | 428/692 |
| 2003/0156362 A1 | 8/2003 | Gill | 360/324.12 |
| 2004/0008454 A1 | 1/2004 | Gill | 360/324.12 |
| 2004/0027853 A1 | 2/2004 | Huai et al. | 365/158 |
| 2004/0075959 A1 | 4/2004 | Gill | 360/324.12 |
| 2004/0080875 A1 | 4/2004 | Pinarbasi | 360/324.2 |
| 2005/0036244 A1 * | 2/2005 | Carey et al. | 360/324.12 |
| 2005/0207073 A1 | 9/2005 | Carey et al. | 360/324.12 |
| 2005/0264950 A1 | 12/2005 | Gill | 360/324.11 |
| 2006/0044707 A1 | 3/2006 | Araki et al. | 360/324.12 |
| 2006/0103991 A1 | 5/2006 | Hoshino et al. | 360/324.12 |
| 2006/0158792 A1 | 7/2006 | Gill | 360/324.11 |

OTHER PUBLICATIONS

IPCOM15941D "Resettable Instack Bias Using Direct Ferromagnetic/Antiferromagnetic Coupling," Abstract, Jun. 21, 2003.

(Continued)

Primary Examiner—A. J. Heinz
(74) Attorney, Agent, or Firm—Zilka-Kotab, PC

(57) ABSTRACT

A magnetoresistive sensor having an in stack bias structure. The sensor includes a bias spacer that allows biasing of free layer magnetic moment in a direction orthogonal to the magnetic moment of the biasing layer.

23 Claims, 6 Drawing Sheets

OTHER PUBLICATIONS

IPCOM14970D "In-Stack HB Structure for Tunnel Valve," Abstract, Jun. 20, 2003.

Jeffrey R. Childress, Michael K. Ho, Robert E. Fontana, Matthew J. Carey, Philip M. Rice, Bruce A. Gurney, Ching H. Tsang, "Spin-Valve and Tunnel-Valve Structures With *In Situ* In-Stack Bias", IEEE Transactions on Magnetics, vol. 38 No. 5, Sep. 2002.

S. Maat and B.A. Gurney, "Perpendicular Coupling Mediated Through Introduction of a Spin-Flop Layer," White Paper, IBM Almaden Research Center, San Jose, CA 95120.

* cited by examiner

MAGNETIC TUNNEL JUNCTION WITH IN STACK BIASING LAYER PROVIDING ORTHOGONAL EXCHANGE COUPLING

FIELD OF THE INVENTION

The present invention relates to free layer biasing in a magnetoresistive sensor, and more particularly to a sensor having an in stack bias layer providing orthogonal biasing of a free layer.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air adjacent to the surface of the disk moves along with the disk. The slider flies on this moving air at a very low elevation (fly height) over the surface of the disk. This fly height is on the order of Angstroms. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is biased parallel to the ABS, but is free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to cos θ, where θ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

Previously manufactured sensors have mainly consisted of what are called current in plane (CIP) GMR sensors. Such sensors are manufactures so that current flows from one side of the sensor to the other in a direction parallel with the planes of the materials making up the sensors. However, another type of GMR sensor that has received increased interest lately is a current perpendicular to plane (CPP) GMR sensor. A CPP sensor is designed so that current flows perpendicular to the planes of the materials making up the sensor (ie. from top to bottom). Electrical leads are formed at the top and bottom of the sensor and may be constructed of magnetic materials to also serve as magnetic shields. The ever increasing demand for improved data rate and data capacity has lead to increased interest in perpendicular recording systems. This has lead to an increased interest in CPP sensors which are particularly suited to use in longitudinal recording systems.

The ever increasing demand for improved data rate and data capacity has also lead to increased interest in Tunnel Junction Magnetoresistive sensors which promise to provide greatly improved magnetoresistance (dr/R) compared to currently manufactured GMR sensors. A tunnel valve includes a magnetic free layer and a magnetic pinned layer, similar to a GMR sensor. However, instead of having an electrically conductive spacer layer, a TMR sensor has a thin, non-magnetic, electrically insulating barrier layer. The TMR sensor operates based on the spin dependent tunneling of electrons through the barrier layer. This spin dependent tunneling varies with the relative orientation of the magnetic moments of the free and pinned layers.

Biasing of the free layer has traditionally been provided by hard magnetic layers formed at either side of the sensor. The hard magnetic layers, such as CoPtCr, couple with the outer edges of the free layer to provide just enough magnetic moment to bias the free layer without pinning it. While, the biasing at the center of the free layer is not equal to biasing at the edges, such biasing schemes have been adequate for prior art sensors. However the push for improved data capacity has required that sensors be made with ever smaller track widths in order to increase the number of tracks that can be recorded onto a disk. As the track width decreases the free layer becomes less magnetically stable. The prior art hard bias schemes become inadequate to maintain sufficient free layer stability.

The use of such traditional hard bias schemes is even more problematic when used in a CPP GMR or TMR sensor, since the electrically conductive hard bias layers must be insulated from the sides of the sensor stack to prevent current shunting. This requires depositing an insulation layer along the sides of the sensor and adjacent to at least one of the top and bottom leads. This separates the hard bias layer from the free layer further degrading the free layer biasing.

In order to overcome these drawbacks, engineers and scientists have sought to develop in-stack bias structures. Such bias structures are built into the sensor stack, such as above the free layer. An example of a sensor having such a prior art in stack bias structure is described with reference to FIG. 1. A sensor 100 has is described herein as a tunnel junction sensor (TMR), but could just as easily be a CIP or CPP GMR sensor. The sensor 100 includes a free layer 102 and a pinned layer 104 separated by a non-magnetic, electrically insulating barrier layer 106. A first AFM layer 108 pins the pinned layer 104.

The sensor 100 also includes first and second leads 110, 112. The leads 110, 112 can be constructed of a magnetic material to serve as magnetic shields as well as leads. A non-magnetic, electrically insulating gap layer 114, 116 extend from the sides of the sensor 100 filling the space between the leads 110, 112. A capping layer 117 such as Ta may be provided at the top of the sensor to protect the sensor layers, and seed layer 119 can be provided at the bottom to promote a desired crystalline growth in the sensor layers.

An in stack bias structure 118, formed over the free layer 102 includes a spacer layer 120, constructed of a non-magnetic, electrically conductive material such as Cu or Ta, formed over the free layer 102. A ferromagnetic bias layer 122 is formed over the spacer layer, and a second AFM layer 124 is formed over the bias layer. The AFM layer 124 pins the magnetic moment of the bias layer in a direction parallel with the ABS as indicated by arrow 126. Magnetostatic or exchange coupling between the free layer 102 and the bias layer 122 across the spacer layer 120 biases the magnetic moment of the free layer in a direction parallel with the ABS and in most cases antiparallel with the moment 126 of the bias layer as indicated by arrow 128.

As those skilled in the art will appreciate, in order for the sensor 100 to be operable, the pinned layer must have it's magnetic moment pinned in a direction perpendicular to the moment 128 of the free layer, such as indicated by arrowhead symbol 130. The pinned layer 104 could be an antiparallel pinned structure, but for purposes of simplicity is shown as a simple pinned layer. The pinned layer is pinned by exchange coupling with the first AFM layer 108.

Annealing the two AFM layers 108, 124 to set the pinned layer 104 and bias layer 126 in perpendicular orientations is problematic. The AFM layers are set by an annealing process that involves raising the temperature of the sensor 100 above the blocking temperature of the AFM material, applying a magnetic field in the desired direction, and then cooling the sensor 100 below the blocking temperature while the magnetic field is applied. However, if the magnetic field is applied in the desired direction to set the pinned layer, it will be in the wrong direction for the bias layer.

One way to overcome this is to use different AFM materials having different blocking temperatures and then doing two annealing steps, one for each AFM layer. However this requires that a less than optimal AFM material be used for at least one of the AFM layers 108, 124. For example if a desired AFM material, such as PtMn is used for the first AFM layer 104, a less than desirable AFM layer having a lower blocking temperature and poorer exchange coupling must be used for the second AFM layer 124. Also, the addition of a second annealing step increases manufacturing time, cost, and increases the potential for sensor degradation during the high temperature anneal.

Another problem exhibited by such prior art in stack bias structures is that they do not provide optimal biasing efficiency. If biasing efficiency is measured as the ratio of free layer moment to bias layer moment, the ratio for such a prior art in stack bias structure is only about 1 to 1.7. This means that relatively thick bias layer must be used to achieve a necessary bias moment. This increased bias layer thickness increases unstability of the exchange coupling between AFM layer 124 and biasing layer 122, increases parasitic resistance, and also increases gap height.

Therefore, there is a strong felt need for an instack bias structure that can provide strong, efficient free layer biasing without the need for a two step AFM annealing process. Such an in stack bias structure would preferably allow the AFM layers of the bias structure and pinned layer to be set in the same direction in a single annealing step and would also allow the use of AFM materials having similar blocking temperatures for both the bias structure and the pinned layer structure if desired.

SUMMARY OF THE INVENTION

The present invention provides an in stack bias structure for use in a magnetoresistive sensor. The bias structure includes thin spacer layer formed over a free layer of the sensor. A bias layer, constructed of a magnetic material, is formed over the spacer layer and has a magnetic moment that is pinned by exchange coupling with an antiferromagnetic (AFM) layer. The free layer has a magnetic moment that is biased in a direction perpendicular to the direction of the magnetic moment of the bias layer.

The spacer layer can be constructed of a material that includes Mn, such as for example a MnX alloy, where X could be Pt, Ir, Rh, Ru, Pd, or Mn. The material X could also be other noble metals. The spacer layer can be 10 to 50 Angstroms thick. The bias layer can be constructed of for example CoFe, and can be constructed as a single layer or as an antiparallel (AP) pinned structure.

The novel orthogonal coupling of the free and bias layers advantageously allows a sensor to be constructed with a single AFM annealing step. An AFM layer used to pin a pinned layer can be annealed in the same direction as the AFM layer used to set the bias layer. This orthogonal coupling also allows the same or similar AFM materials to be used in both the pinned layer AFM and in the bias layer AFM.

Another advantage provided by the present invention is that the biasing ratio is increased by 1 to 3 times over the prior art biasing structure. This allows a thinner bias layer to be used, which advantageously decreases parasitic resistance and decreases the gap height.

A sensor constructed according to the present invention can also include a MgO barrier layer. Sensors having the novel biasing structure and a MgO barrier layer have exhibited a 200 percent increase in sensor performance over previous sensors.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
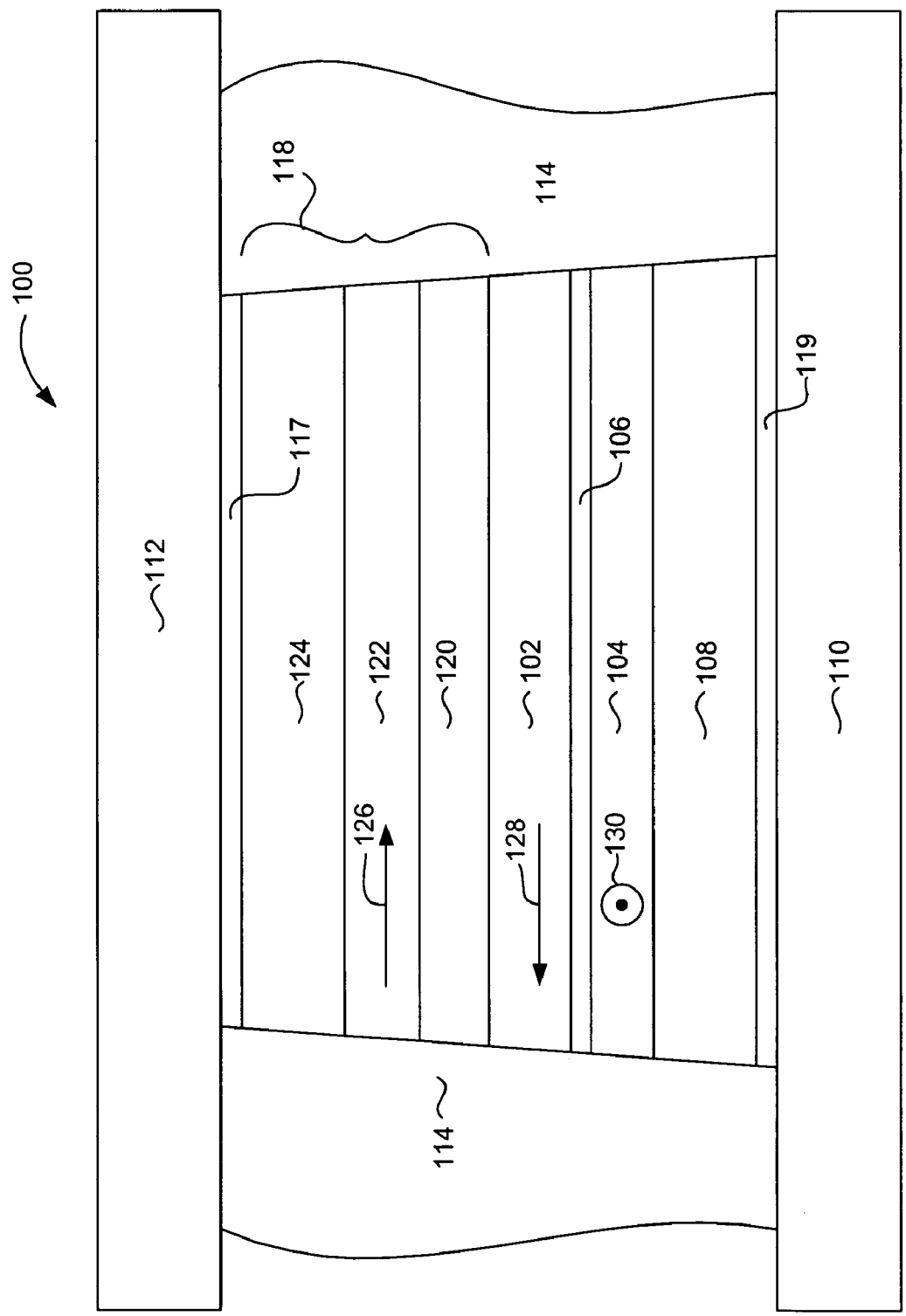
FIG. 1 is an ABS view of a prior art magnetoresistive sensor and in stack bias structure.
Figure 2:
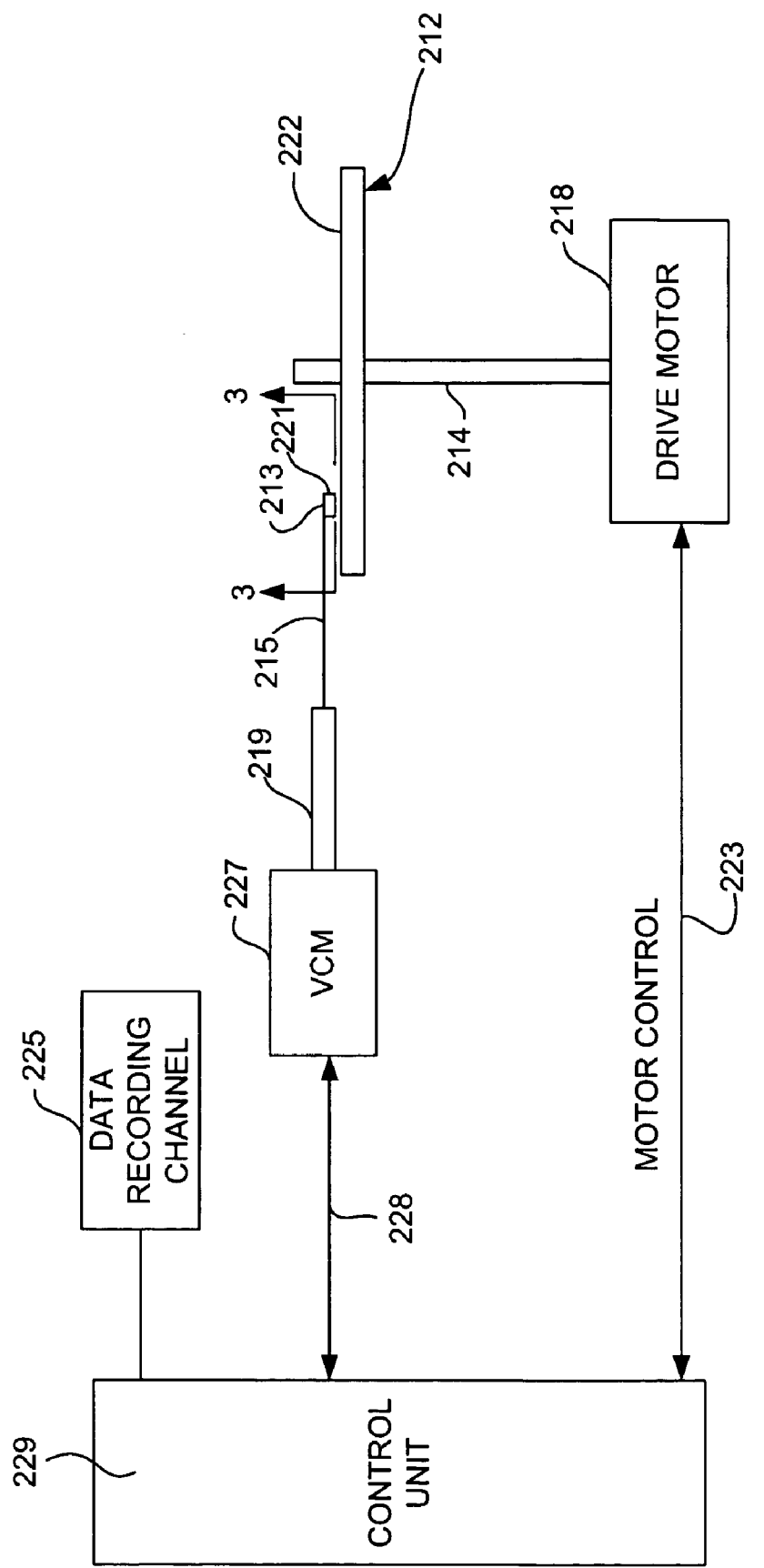
FIG. 2 is a schematic illustration of a disk drive system in which the invention might be embodied.

Referring now to FIG. 2, there is shown a disk drive 200 embodying this invention. As shown in FIG. 2, at least one rotatable magnetic disk 212 is supported on a spindle 214 and rotated by a disk drive motor 218. The magnetic recording on each disk is in the form of annular patterns of concentric data tracks (not shown) on the magnetic disk 212.

At least one slider 213 is positioned near the magnetic disk 212, each slider 213 supporting one or more magnetic head assemblies 221. As the magnetic disk rotates, slider 213 moves radially in and out over the disk surface 222 so that the magnetic head assembly 221 may access different tracks of the magnetic disk where desired data are written. Each slider 213 is attached to an actuator arm 219 by way of a suspension 215. The suspension 215 provides a slight spring force which biases slider 213 against the disk surface 222. Each actuator arm 219 is attached to an actuator means 227. The actuator means 227 as shown in FIG. 2 may be a voice coil motor (VCM). The VCM comprises a coil movable within a fixed magnetic field, the direction and speed of the coil movements being controlled by the motor current signals supplied by controller 229.

During operation of the disk storage system, the rotation of the magnetic disk 212 generates an air bearing between the slider 213 and the disk surface 222 which exerts an upward force or lift on the slider. The air bearing thus counter-balances the slight spring force of suspension 215 and supports slider 213 off and slightly above the disk surface by a small, substantially constant spacing during normal operation.

The various components of the disk storage system are controlled in operation by control signals generated by control unit 229, such as access control signals and internal clock signals. Typically, the control unit 229 comprises logic control circuits, storage means and a microprocessor. The control unit 229 generates control signals to control various system operations such as drive motor control signals on line 223 and head position and seek control signals on line 228. The control signals on line 228 provide the desired current profiles to optimally move and position slider 213 to the desired data track on disk 212. Write and read signals are communicated to and from write and read heads 221 by way of recording channel 225.

Figure 3:
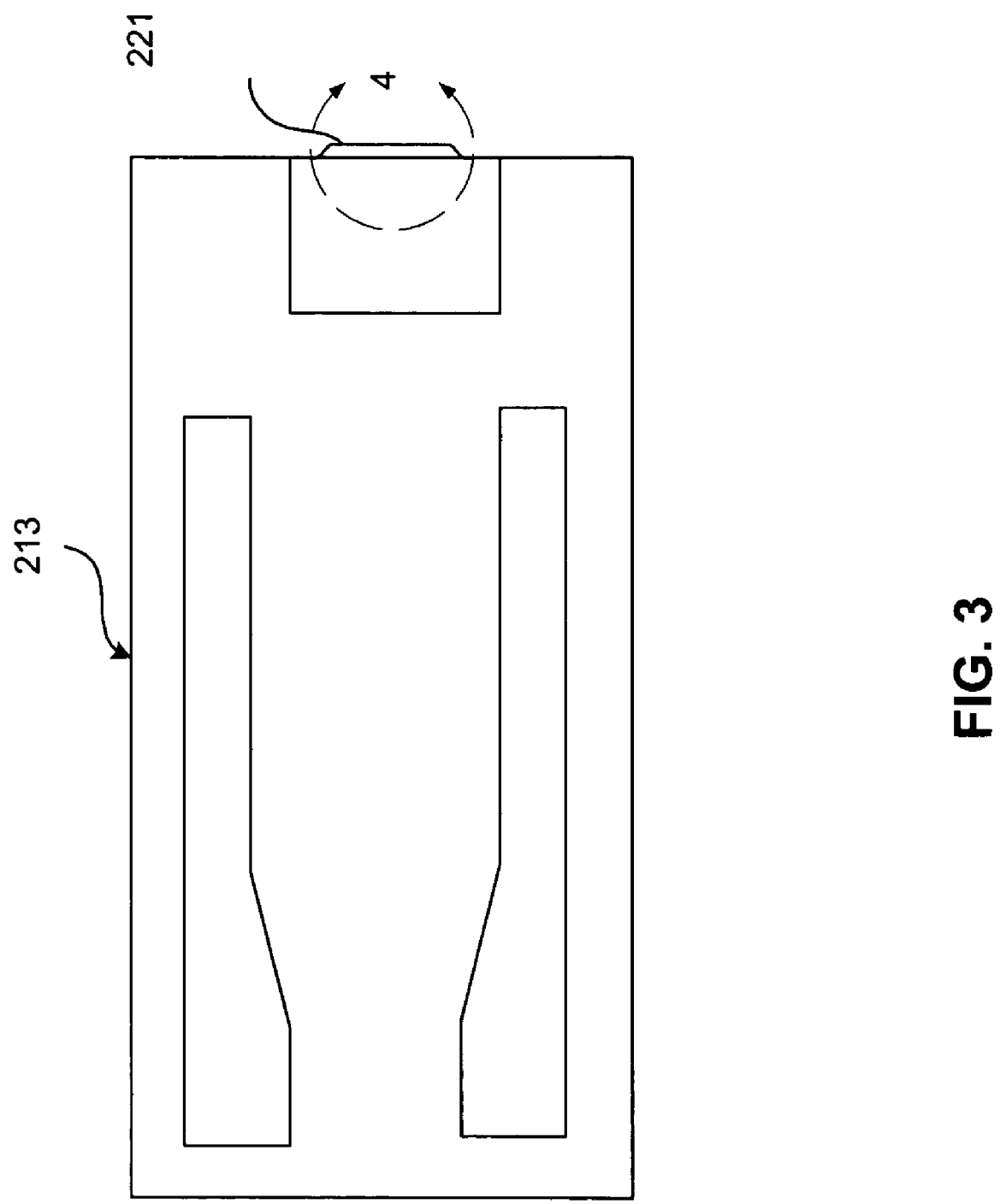
FIG. 3 is an ABS view of a slider, taken from line 3—3 of FIG. 2, illustrating the location of a magnetic head thereon.

With reference to FIG. 3, the orientation of the magnetic head 221 in a slider 213 can be seen in more detail. FIG. 3 is an ABS view of the slider 213, and as can be seen the magnetic head including an inductive write head and a read sensor, is located at a trailing edge of the slider. The above description of a typical magnetic disk storage system, and the accompanying illustration of FIG. 2 are for representation purposes only. It should be apparent that disk storage systems may contain a large number of disks and actuators, and each actuator may support a number of sliders.

Figure 4:
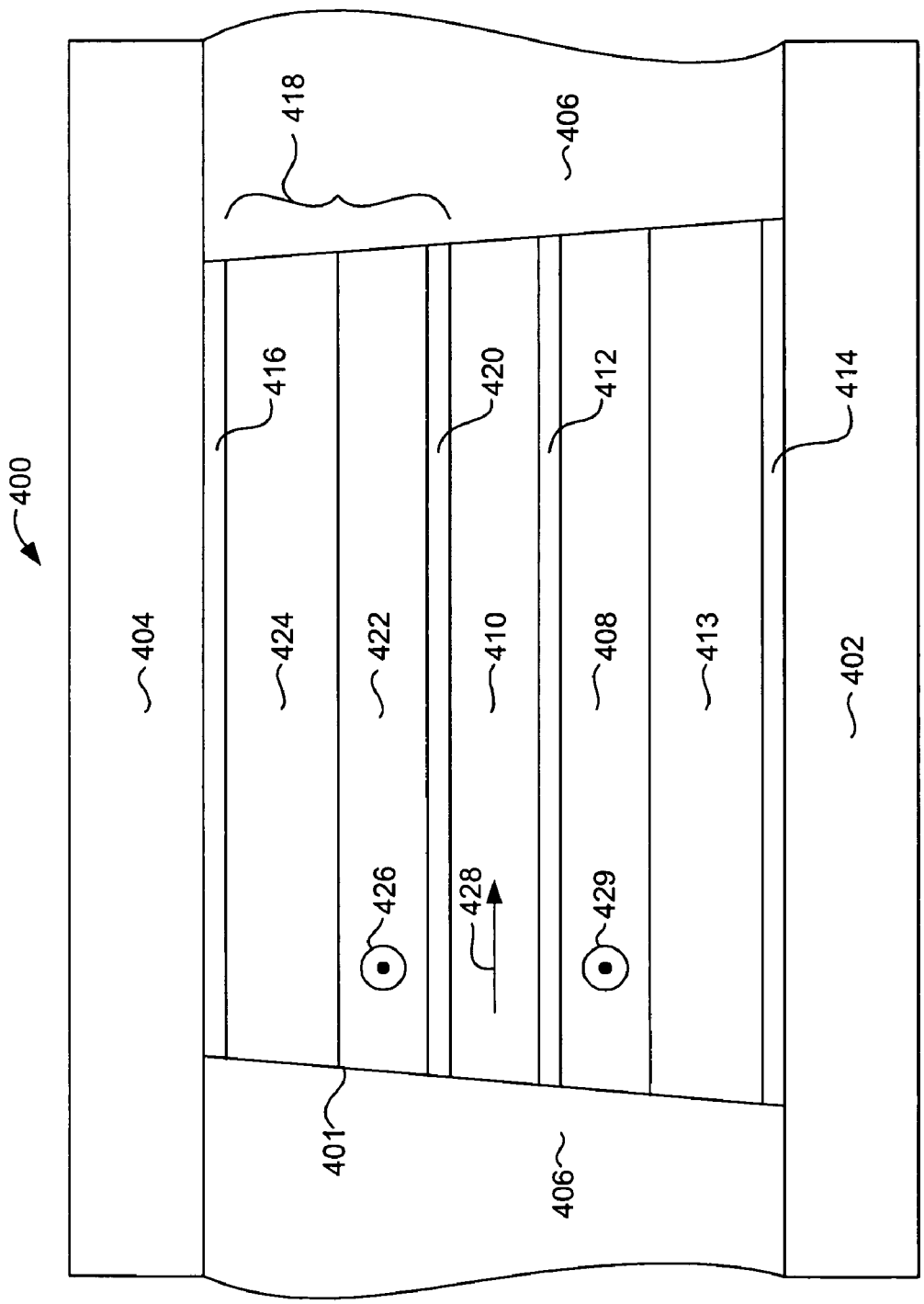
FIG. 4 is an ABS view of a magnetic sensor according to an embodiment of the present invention taken from circle 4 of FIG. 3.

With reference now to FIG. 4, a magnetoresistive sensor 400 according to an embodiment of the invention includes sensor stack 401 sandwiched between first and second electrically conductive leads 402, 404. The leads 402, 404 can be constructed of a magnetic material so that they can also serve as magnetic shields. An electrically insulating, non-magnetic gap material 406 extends from the sides of the sensor stack 401 filling the space between the leads 402, 404.

The sensor stack 401 includes a pinned layer 408, a free layer 410 and a non-magnetic barrier layer 412. The free layer 404 can be constructed of several materials and is preferably CoFe. The free layer 410 can also be constructed of multiple layers of magnetic material, with a material comprising Co preferably being disposed adjacent to the barrier layer 412. The pinned layer 408 can be a simple pinned layer or an antiparallel (AP) coupled pinned layer, and can be constructed of a magnetic material such as CoFe.

The barrier layer 412 is preferably constructed of MgO, which has been found to provide exceptional performance enhancement over other barrier layers such a $Al_2O_3$. In fact the use of MgO as a barrier layer provides a 200% improvement over other prior art barrier layers. Sensors using a MgO barrier have been found to have a RA of $4 Ohm\mu m^2$ and a TMR of 36%. This is compared with RA of $3 Ohm\mu m^2$ and 18% TMR for sensors using barrier layers such as $Al_2O_3$.

The pinned layer 408 is pinned by exchange coupling with an antiferromagnetic (AFM) material 413, such as PtMn or IrMn. A seed layer or buffer layer 414 at the bottom of the sensor stack 401 initiates a desired crystalline growth in subsequently deposited layers to maximize sensor performance. A capping layer 416 at the top of the sensor stack 401 protects the layers of the sensor stack 401 from damage such as by corrosion during subsequent manufacturing processes such as the AFM annealing process.

In Stack Bias Structure:

With continued reference to FIG. 4, the free layer 410 is biased by a novel in stack bias structure 418. The in stack bias structure includes a spacer layer 420 formed adjacent to the free layer 410. A bias layer 422 is formed adjacent to the spacer layer 420 opposite the free layer 410, and a layer of antiferromagnetic material (AFM) 424 is exchange coupled with the bias layer to pin the magnetic moment of the bias layer 422.

The spacer layer 420 is specially configured to orthogonally couple the free layer 410 with the bias layer 422, such that the bias layer 422 has a magnetic moment that is configured perpendicular to the ABS as indicated by arrow head symbol 426, while the free layer has a magnetic moment 428 that is oriented parallel with the ABS and perpendicular to the moment 426 of the bias layer 422.

Since the moment 426 of the bias layer is oriented perpendicular to the moment 428 of the free layer, the moment 426 of the bias layer 422 can be in the same direction as the magnetic moment of the pinned layer, which is indicated by arrow head symbol 429. This means that the AFM layers 413, 424 used to pin the pinned layer 408 and the bias layer 422 can be set in a single annealing step, and the AFM layers 413, 424 can be constructed of the same material.

In order to provide the desired orthogonal coupling between the free layer 410 and the bias layer 422, the spacer layer 420 is preferably constructed of a material comprising Mn. The spacer layer 420 is preferably PtMn, but could also be constructed of other materials, including IrMn, RhMn, RuMn, PdMn, NiMn, FeMn, RuRhMn, PtPdMn, PtCrMn, or an alloy of MnX where X includes a noble metal. Also, in order to provide the desired orthogonal coupling, the spacer layer 420 is preferably about 10 to 20, more preferably about 12 to 14 Angstroms thick.

The bias layer 422 is preferably constructed of a ferromagnetic material such as CoFe. The bias layer 422 is exchange coupled with the AFM layer 424 so that it's magnetic moment 426 is pinned perpendicular to the ABS and perpendicular to the moment 428 of the free layer 422. The AFM layer 424 can be constructed of several available AMF materials, but is preferably constructed of IrMn or XMn where X is selected at least one element from the group of Ru, Rh, Cr, Pd, Pt, Ir, Au, Ag, Ni, and Fe. The AFM layer 413 could also be constructed of IrMn, but is preferably constructed of PtMn.

We have found that when the spacer layer described above is constructed at the thicknesses described above a desirable orthogonal coupling occurs. This orthogonal coupling greatly improves sensor performance and greatly facilitates ease of manufacture, making the in stack bias structure of the present invention much more practical than other prior art structures. The structure described has also been found to greatly increase the biasing strength and efficiency. This allows a thinner biasing stack to be constructed, resulting in decreased parasitic resistance and decreased stripe height. The improved biasing strength also ensures adequate free layer stability at the narrower track widths of future generation sensors. As mentioned above, although the bias structure of the present invention has been described in terms of a tunnel junction sensor, it could just as easily be used with a CPP or CIP GMR sensor. It should also be pointed out that, while the invention has been illustrated as having the free layer 410 and bias structure above the pinned layer 408, the invention could also be practiced in a sensor having a free layer and bias structure formed at the bottom of the sensor stack and the pinned layer formed at the top. Furthermore, for purposes of simplicity the pinned layer 408 has been illustrated as a simple pinned layer, but could also be an AP coupled pinned layer.

Figure 5:
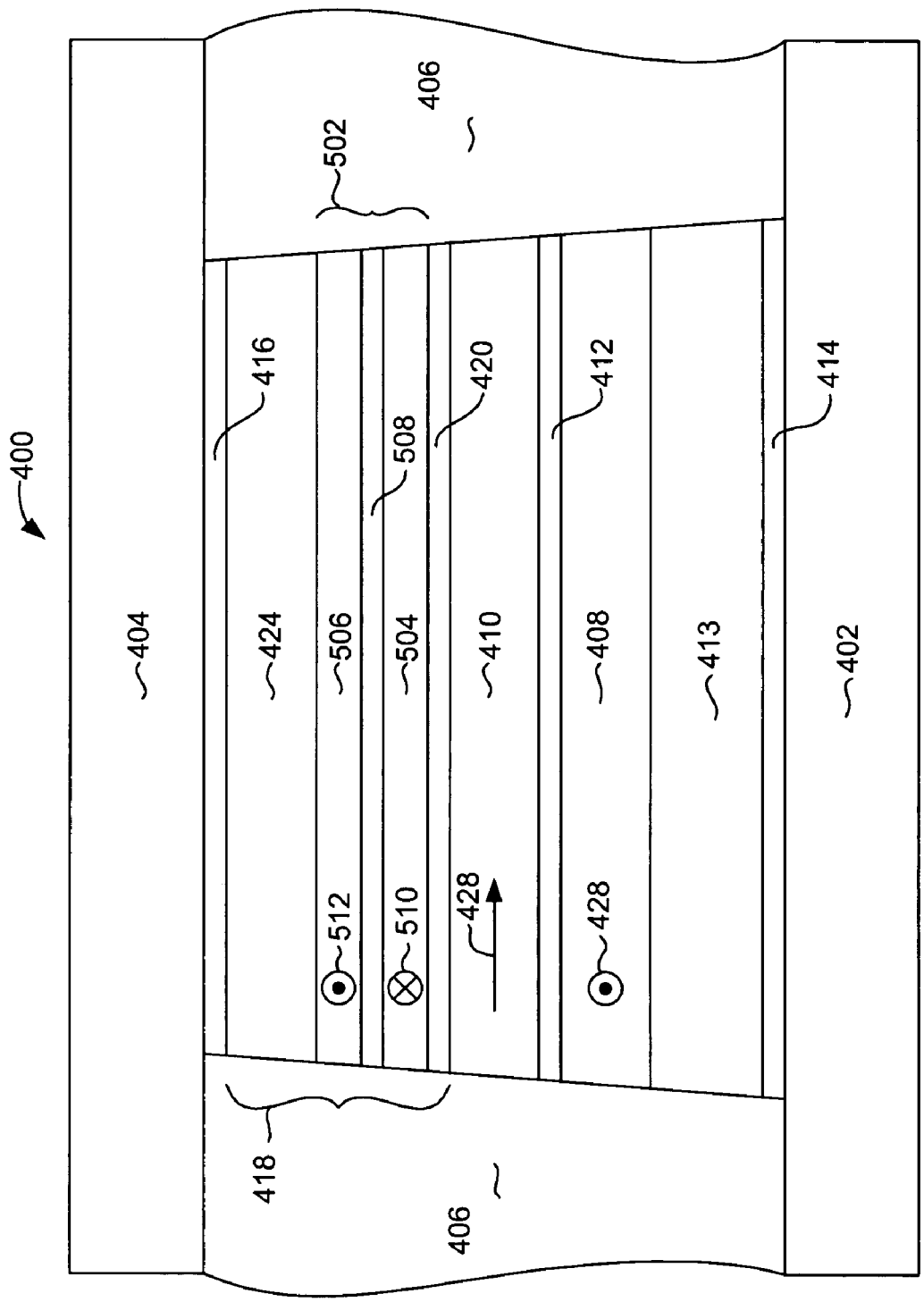
FIG. 5 is an ABS view of a magnetic sensor according to an alternate embodiment of the invention.

With reference now to FIG. 5, an alternate embodiment of the invention includes a antiparallel (AP) coupled bias layer 502. The AP coupled bias layer 502 can include first and second magnetic layers 504, 506 separated by and exchange coupled with an AP coupling layer 508, which can be, for example Ru. The magnetic layers 504, 506 have magnetic moments 510, 512 that are oriented antiparallel with one another.

Constructing the bias layer 502 as an AP coupled structure adds a certain amount of manufacturing complexity. However, the AP coupled structure provides the benefit that it reduces or eliminates magnetostatic coupling from the bias layer, thereby further improving free layer stability.

Figure 6:
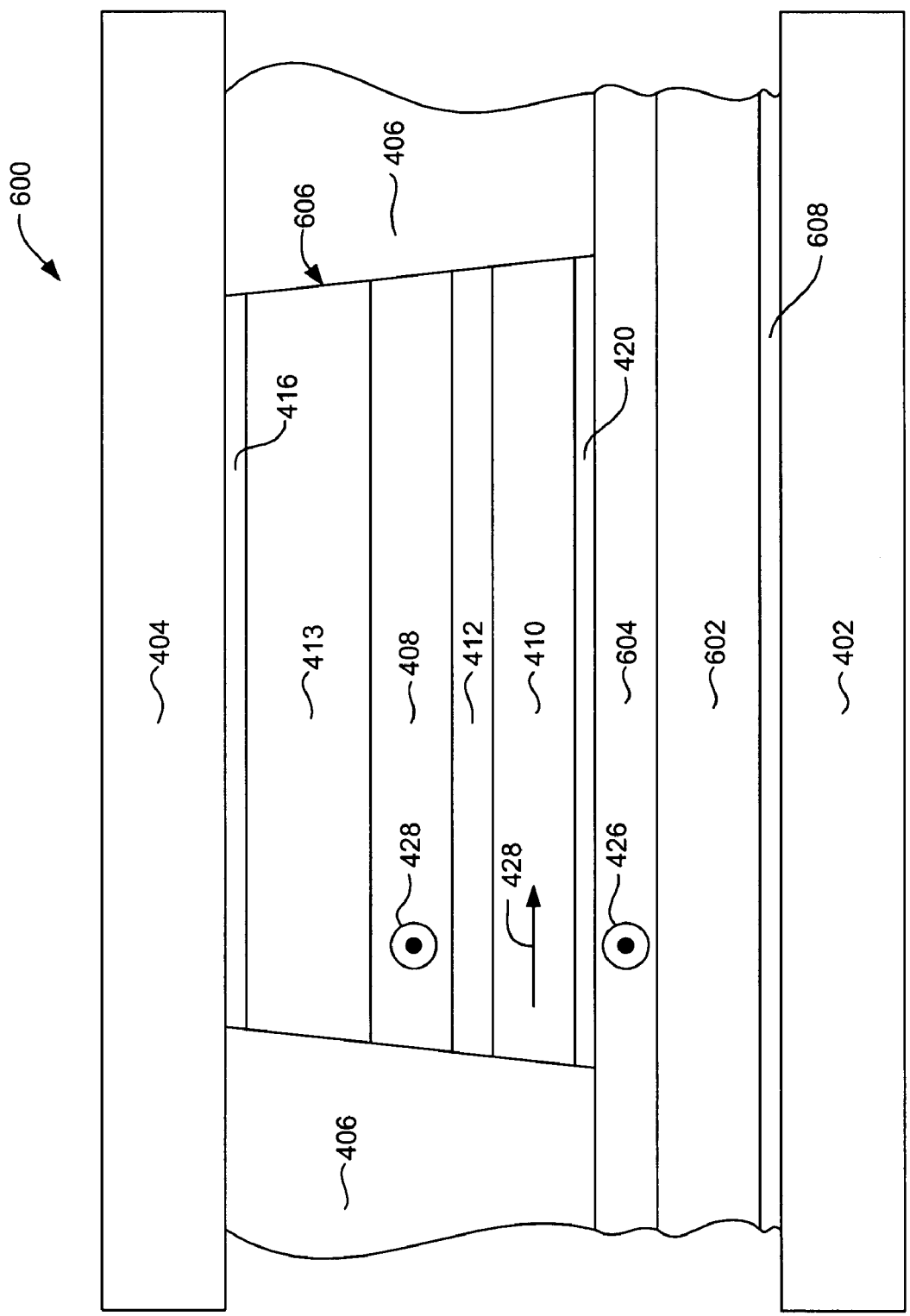
FIG. 6 is an ABS view of a magnetic sensor according to yet another embodiment of the invention.

With reference now to FIG. 6, an unpatterned bias layer 602 and associated AFM layer 604 can be provided to further reduce parasitic resistance in the sensor. In this design, the bias layer 602 and AFM layer 604 would be constructed to extend beyond the sides of the active portion of the sensor stack 606. The layers beneath the AFM layer 604, such as a seed layer 608 would also be unpatterned and would extend beyond the active region of the sensor stack. Such a structure could be constructed by terminating the milling process (that which is used to pattern the sensor) prior to removing the bias layer.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising
a magnetic free layer;
a ferromagnetic bias layer;
a thin spacer layer having a thickness of 10-20 Angstroms sandwiched between the free layer and the bias layer, wherein the spacer layer comprises MnX, where X is a noble metal; and
a layer of antiferromagnetic material exchange coupled with the bias layer;
wherein
the ferromagnetic bias layer has a first magnetic moment that is pinned in a first direction, and the magnetic free layer has a second magnetic moment that is biased in a second direction that is perpendicular to the first direction.

2. A magnetoresistive sensor as in claim 1 wherein the spacer layer comprises Mn.

3. A magnetoresistive sensor as in claim 1, wherein the spacer layer comprises CoFeO.

4. A magnetoresistive sensor as in claim 1, wherein the spacer layer has a thickness of 12 to 14 Angstroms.

5. A magnetoresistive sensor as in claim 1, wherein the layer of antiferromagnetic material comprises XMn, where X comprises a material selected from the group consisting of: Ru, Rh, Cr, Pd, Pt, Ir, Au, Ag, Ni, and Fe.

6. A magnetoresistive sensor as in claim 1 wherein the free layer is orthogonally coupled with the bias layer.

7. A magnetoresistive sensor as in claim 1 wherein the bias layer is a single layer comprising CoFe.

8. A magnetoresistive sensor as in claim 1 wherein the bias layer comprises first and second ferromagnetic layers antiparallel coupled across an antiparallel coupling layer.

9. A magnetoresistive sensor as in claim 8 wherein the first and second magnetic layers of the bias layer each comprise CoFe and wherein the antiparallel coupling layer comprises Ru thickness of 3 to 8 Angstroms.

10. A magnetoresistive sensor as in claim 1 further comprising:
a magnetic pinned layer; and
a barrier layer comprising MgO sandwiched between the free layer and the pinned layer.

11. A sensor as in claim 1, wherein the sensor is a giant magnetoresistive (GMR) sensor.

12. A sensor as in claim 1, wherein the sensor is a current in plane (CIP) giant magnetoresistive (GMR) sensor.

13. A sensor as in claim 1 wherein the sensor is a current perpendicular to plane (CPP) giant magnetoresistive (GMR) sensor.

14. A magnetoresistive sensor, comprising
a magnetic free layer;
a ferromagnetic bias layer;
a thin spacer layer having a thickness of 10-20 Angstroms sandwiched between the free layer and the bias layer; and
a layer of antiferromagnetic material exchange coupled with the bias layer; wherein
the ferromagnetic bias layer has a first magnetic moment that is pinned in a first direction, and the magnetic free layer has a second magnetic moment that is biased in a second direction that is perpendicular to the first direction; wherein the spacer layer comprises MnX, where X comprises a material selected from the list consisting of: Pt, Ir, Rh, Ru, Pd, Ni, Fe, and RuRh.

15. A tunnel junction magnetoresistive sensor comprising:
a magnetic free layer;
a barrier layer comprising MgO;
a spacer layer having a thickness of 10-20 Angstroms comprising PtMn, the free layer being sandwiched between the barrier layer and the spacer layer;
a ferromagnetic biasing layer disposed adjacent to the spacer layer at a side of the spacer layer opposite the free layer; and
an antiferromagnetic layer comprising IrMn exchange coupled with the ferromagnetic biasing layer.

16. A tunnel junction sensor as in claim 15 wherein the free layer has a first magnetic moment that is biased in a first direction and wherein the bias layer has a second magnetic moment that is pinned in a second direction that is perpendicular to the first direction.

17. A tunnel junction magnetoresistive sensor, comprising
a magnetic pinned layer;
a magnetic free layer;
a magnetic bias layer;
a non-magnetic, electrically insulating barrier layer sandwiched between the free layer and the pinned layer;
a first layer comprising Mn exchange coupled with the pinned layer;
a second layer comprising Mn sandwiched between the bias layer and the free layer and having a thickness of 10-20 Angstroms; and
a third layer comprising Mn exchange coupled with the bias layer; wherein the second layer comprising Mn is an alloy comprising MnX, wherein X is a noble metal.

18. A tunnel junction sensor as in claim 17, wherein:
the pinned layer has a first magnetic moment that is pinned in a first direction;
the bias layer has a second magnetic moment that is pinned in the first direction; and
the free layer has a third magnetic moment that is biased in a second direction that is perpendicular to the first direction.

19. A tunnel junction sensor as in claim 17 wherein the barrier layer comprises MgO.

20. A tunnel junction sensor as in claim 17 wherein the third layer comprising Mn is an alloy comprising Mn and Ir.

21. A tunnel junction magnetoresistive sensor, comprising
a magnetic pinned layer;
a magnetic free layer;
a magnetic bias layer;
a non-magnetic, electrically insulating barrier layer sandwiched between the free layer and the pinned layer;
a first layer comprising Mn exchange coupled with the pinned layer;
a second layer comprising Mn sandwiched between the bias layer and the free layer and having a thickness of 10-20 Angstroms; and
a third layer comprising Mn exchange coupled with the bias layer; wherein the second layer comprising Mn is an alloy comprising MnX, where X comprises a material selected from the group consisting of: Pt, Ir, Rh, Ru, Pd, Ni, Fe and RuRh.

22. A tunnel junction magnetoresistive sensor, comprising
a magnetic pinned layer;
a magnetic free layer;
a magnetic bias layer;
a non-magnetic, electrically insulating barrier layer sandwiched between the free layer and the pinned layer;
a first layer comprising Mn exchange coupled with the pinned layer;
a second layer comprising Mn sandwiched between the bias layer and the free layer and having a thickness of 10-20 Angstroms; and
a third layer comprising Mn exchange coupled with the bias layer; wherein the second layer comprising Mn further comprises Pt.

23. A tunnel junction magnetoresistive sensor comprising:
a magnetic free layer;
a barrier layer comprising MgO;
a spacer layer comprising PtMn and having a thickness of 10-20 Angstroms, the free layer being sandwiched between the barrier layer and the spacer layer;
a ferromagnetic biasing layer disposed adjacent to the spacer layer at a side of the spacer layer opposite the free layer; and
an antiferromagnetic layer comprising IrMnX exchange coupled with the ferromagnetic biasing layer, wherein X is selected from the group of materials consisting of Ru, Rh, Cr, Pd, Pt, Ir, Au, Ag, Ni and Fe.

* * * * *